United States Patent [19]

Typlin et al.

[11] Patent Number: 5,422,229
[45] Date of Patent: Jun. 6, 1995

[54] LIQUID FOIL EMPLOYING ALUMINUM PLATELETS

[75] Inventors: Barry Typlin; John E. Murtaugh, both of Chicago, Ill.

[73] Assignee: Fabco Products, Inc., Crestwood, Ill.

[21] Appl. No.: 198,255

[22] Filed: Feb. 18, 1994

Related U.S. Application Data

[62] Division of Ser. No. 106,570, Aug. 16, 1993.

[51] Int. Cl.$^6$ ............ G03F 7/30; G03F 7/021; G03F 7/11; G03C 1/795
[52] U.S. Cl. .................. 430/325; 430/158; 430/160; 430/258; 430/262; 430/271; 430/278; 430/293; 430/295; 156/239; 156/240
[58] Field of Search .......... 156/239, 240; 430/325, 430/271, 278, 320, 258, 158, 160, 292, 293, 262, 295

[56] References Cited

U.S. PATENT DOCUMENTS

| | | | |
|---|---|---|---|
| 309,914 | 12/1884 | Abbott . | |
| 2,839,379 | 6/1958 | Erasmus | 75/0.5 |
| 2,941,894 | 6/1960 | McAdow | 106/193 |
| 3,314,814 | 4/1967 | Newman | 117/361 |
| 3,769,055 | 10/1973 | Blanco | 117/31 |
| 4,044,181 | 8/1977 | Edhlund | 428/40 |
| 4,116,710 | 9/1978 | Heikel | 106/290 |
| 4,258,125 | 3/1981 | Edhlund | 430/293 |
| 4,477,312 | 10/1984 | Czichy | 156/656 |
| 4,581,320 | 4/1986 | Kreiter | 430/320 |
| 4,591,527 | 5/1986 | Czichy | 428/201 |
| 4,833,066 | 5/1989 | Fuchs | 430/292 |
| 5,232,814 | 8/1993 | Graves et al. | 430/293 |

FOREIGN PATENT DOCUMENTS 1543981 4/1979 United Kingdom .

*Primary Examiner*—Charles L. Bowers, Jr.
*Assistant Examiner*—John S. Chu
*Attorney, Agent, or Firm*—Patula & Associates

[57] ABSTRACT

A photosensitive layered sheet for producing transferrable decorative foil designs comprising a solvent resistant, hydrophobic plastic film having superimposed thereon the following sequential layers of coatings:

(a) a clear or colored water insoluble lacquer;
(b) a clear water soluble polymer;
(c) an organic solvent containing from 2-8% by weight of aluminum platelets having their largest dimension not greater than about 5000 microns and a thickness not greater than 1000 angstroms;
(d) an ink extender;
(e) an ink coat powder, and
(f) a pre-sensitized photographic emulsion.

A method of making these photosensitive layered sheets.

8 Claims, No Drawings

LIQUID FOIL EMPLOYING ALUMINUM PLATELETS

This is a divisional of application Ser. No. 08/106,570 filed on Aug. 16, 1993, allowed.

The present invention relates to the field of liquid foil sheets used to decorate a variety of surfaces.

BACKGROUND OF THE INVENTION

In the past, hot stamp foil used to make decorative foil sheets has always been a problem in the color proofing industry. Color proofing is a "cold" process. Conventional hot stamp foil will not work with this process. As a result, hot stamp foil has to be custom made at minimum run requirements. This run is usually in size 24" by 40,000' per color. This requirement offers problems which include having to stock large amounts of foil, limiting the number of colors offered because of run requirements and damage to foil sheets in re-packaging for shipping.

In order to have the foil work for the "cold" process, it must have a very easy release from the substrate thus making it very fragile to handle. These problems are passed on to the color proofers. Because the foil is "pre-coated" or made by a hot stamp foil manufacturer, the color proofer has no control over the workable qualities of the material; i.e. ease of release from the substrate, sensitivity of transferring and color intensity.

Because of the fragility of the foil, it is difficult to process an image without damage and scratching. Another problem is the need of an acid bath or caustic bath to develop the image. Critical timing is needed to avoid "under cutting" of image, which is more apparent with fine line images.

Designers want to see a specific color that will eventually be printed in a hot stamp foil. They send a swatch of the color to the color proofer to match for a rub-down transfer. The color proofer often cannot make this determination because of the limited number of foils available for this process.

Designers consider as being desirable a complete transfer with a color and foil on one piece. Also desirable would be for the color to overprint the foil. This cannot be accomplished using pre-coated foil.

OBJECTS OF THE INVENTION

It is an object of the invention to provide an improved photosensitive layered sheet for producing transferrable decorative foil designs.

Another object of the invention is to furnish a method or process of making foil design sheets that are easily produced to be of any desired color, yet are not conventional hot stamp foils.

A further object of the invention is to allow easily made foil transfers utilizing a variety of substrates.

Yet another object is the production of a decorative foil assembly where the printing order may be varied.

Further objects of the invention are the elimination of fragile coated substrates and etching solutions which now present problems associated with hot transfer coating foil transfers.

DESCRIPTION OF THE INVENTION

The present invention comprises a photosensitive layered sheet for producing transferrable decorative foil designs. It comprises a solvent resistant, hydrophobic plastic film having superimposed thereon the following sequential layers of coatings:

a) a clear or colored water insoluble lacquer;
b) a clear water soluble polymer;
c) an organic solvent containing from 2-8% by weight of aluminum platelets having their largest dimension not greater than about 5000 microns and a thickness not greater than 1000 angstroms;
d) an ink extender;
e) an ink coat powder, and
f) a pre-sensitized photographic emulsion.

The Solvent Resistant Hydrophobic Plastic Film

This film may be selected from a wide variety of hydrophobic films. In a preferred embodiment they are clear plastic sheets. These sheets should be of sufficient thickness to allow handling. Usually they will be several mils in thickness. Typical of such plastic sheeting, and representing preferred film materials are polypropylene sheets. Other plastic sheeting such as Mylar, polytetrafluoroethylene, may be employed. The clear sheets are preferred since the colored dyes contained in the water insoluble lacquer are more readily viewed while the decorative foils are being applied. The sheets should be capable of receiving a variety of adhesives to allow their permanent placement on a variety of surfaces such as wood, metals, glass, plastics and the like.

The Water Insoluble Lacquer

These materials are well known to the printing industry. Examples of such lacquers are the nitrocellulose lacquers, cellulose acetate and lacquers made from the acrylate esters such as ethyl and methyl acrylate. Nitrocellulose lacquer is the preferred lacquer.

The lacquers are capable of being colored by the use of dyes that are soluble in the lacquer. Typical of such dyes are:

Orasol (ciba-geigy) New Jersey
Oracet
Monastral
Irgalite
Irgazin
Cromophtal
Filamid
Filester Orasol is the preferred dye.

When a non-colored foil product is desired, the dye is omitted and just a clear lacquer is applied.

The Clear Water Soluble Polymer (Gloss Coat)

These polymers may be natural polymers such as the gums or they may be synthetic such as the water soluble polymers of acrylic acid, methacrylic acid, acrylamide polymers and the like. Polyvinyl alcohol is another synthetic polymer that may be used with good results.

The Organic Solvent Containing the Aluminum Platelets (Liquid Foil)

These materials, as generally described above, are the subject of U.S. Pat. No. 4,116,710 the disclosure of which is incorporated herein by reference. In a preferred embodiment of the invention, the platelets have an average length ranging between about 100-1000 microns. A most preferred product contains an aluminum flake having the following length particle size distribution set forth below:

| Particle Size Distribution ** (Length/Microns) | | | |
|---|---|---|---|
| Group: | Low | High | Cumulative % |
| | 3.600 | 4.900 | 15.330 |
| | 4.908 | 7.950 | 33.800 |
| | 7.957 | 10.630 | 48.200 |
| | 10.663 | 14.208 | 62.310 |
| | 14.209 | 18.980 | 81.170 |
| | 18.986 | 27.940 | 94.320 |
| | 27.945 | 37.340 | 96.790 |
| | 37.342 | 45.300 | 100.000 |

** Particle size distribution, as measured by a Dapple Image Plus TM analyzer, represents the expected range of particle sizes and distribution, batch-to-batch, for these products. Particle size is measured by image analysis and fitted with a logarithmic distribution which represents the expected range, batch-to-batch.

The particles have thicknesses ranging between 200–1000 angstroms. Typically and preferably the thickness is between 350–600 angstroms.

The aluminum flakes are available as a concentrate containing 10% by weight of the flakes in a variety of organic solvents. Such products are listed below:

| Various Solutions Mixed In Combination with the Aluminum Flake | |
|---|---|
| *Aluminum Flake | = |
| Glycol ether PM | = A |
| (Propylene Glycol Methyl Ether (CH$_3$OCH$_2$CHOHCH$_2$)) | |
| Acetone | = B |
| PM Acetate | = C |
| (Propylene Glycol Methyl Ethyl Acetate (CH$_3$OCH$_2$CH(CH$_3$)OOCCH$_3$)) | |
| Ethyl Acetate | = D |
| IPA | = E |
| (Isopropyl Alcohol ((CH$_3$)$_2$CHOH)) | |
| Toluene | = F |
| Hexane | = G |
| *Catalyst | = H |

To be used in the invention it is necessary that products as described be diluted with the same or different solvents of the type shown above. The amount of dilution varies from between 30 to 70% by weight. The diluted products provides a finished aluminum flake suspension containing from about 3–7% by weight of the aluminum flakes which is a preferred range. Listed below are a variety of examples of solvent diluted flake products that may be used to practice the invention.

1. Ethyl Acetate*/Flake Mixture+A, B, C, D, E, F. Variable 30% Mixture+70% Additive to 70%* Mixture+30% Additive.
2. Glycol Ether PM*/Flake Mixture+A, B, C, D, E, F. Variable 30%* Mixture+70% of Additive to 70%* Mixture+30% Additive.
3. Acetone*/Flake+A, B, C, D, E, F. Variable 30%* Mixture +70% Additive to 70%* Mixture+30% Additive.
4. Ektasolve PM Acetate*/Flake Mixture+A, B, C, D, E, F. Variable 30%* Mixture+70% Additive, to 70%* Mixture+30% Additive.
5. Toluene*/Flake Mixture+A, B, C, D, E, F. Variable 30%* Mixture+70% Additive to 70%* Mixture+30% Additive.
6. IPOH*(Isopropyl Alcohol ((CH$_3$)$_2$CHOH))/Flake Mixture+A, B, C, D, E, F. Variable 30%* Mixture+70% Additive to 70%* Mixture+30% Additive.
7. Glycol Ether PM*/Flake Mixture+H Catalyst. Variable 30% * Mixture+70% H to 70% * Mixture+30% H.

Catalyst H is a mixture containing the following=- H$_2$O, IPA, Kodak Photoflo or H$_2$O, Kodak Photoflo in a mixture of the approximate ratio.

50% to 90% H$_2$O,
50% to 10% IPA, or

50% to 90% H$_2$O
50% to 5% IPA
5% to 0% Kodak Photoflo, or

50% to 99% H$_2$O,
50% to 1% Kodak Photoflo

Best results were achieved when then approximate mixture shown below is used:

75% H$_2$O, 23% IPA, 2% Photoflo, or
96% H$_2$O, 4% Photoflo

It has been discovered the following combination has yielded the best results for the process:

1A. Ethyl Acetate*/Flake Mixture+A. (A=Glycol Ether PM) in the approximate blend of:
45%* Mixture to 55% A.
50%* Mixture to 50% A.

This combination is assuming that the Liquid Foil is coated with the "Gloss Coat" as a preceding coating on the clear water insoluble lacquer (foil clear) or the colored water insoluble lacquer (foil color). Any of combinations 1 through 6 and variables if used without Gloss Coat will result in the Liquid Foil having a frosted appearance and not a mirror-like quality.

It has been discovered that combination 7 will work without the use of the Gloss Coat, i.e., coated directly onto the foil clear or foil color and have a mirror-like appearance although not as reflective as 1 through 6 or 1A. The combination is as follows:

50% Glycol Ether*/Flake to 50% H Catalyst.
45% Glycol Ether*/Flake to 55% H Catalyst.

Two problems occur with using this mixture in the Liquid Foil transfer process:

1. The catalyst must be mixed just prior to use.
2. Mixture "spoils" after approximately a 5 day period (Flake turns white and cannot be coated).

It has been discovered that one more combination of mixtures or procedure can be used without the use of the Gloss Coat or coated directly onto the foil clear or foil color. This combination is as reflective as combination 1 through 6 but requires two coatings of the same material. The combination is as follows:

6—IPOH*/Flake Mixture+E (IPA) or G (Hexane). 50% Mixture to 50% E or G. 30% Mixture to 70% E or G.

Two problems occur in this procedure in the Liquid Foil transfer process:

1. The Liquid Foil coating cannot be backed with another coating (i.e. ink, photocoat, etc.) without pulling the mirror-like finish.
2. In having to make 2 coatings of the mixture the first coating is very delicate to scratching when the second coating is applied.

Thus, it has been discovered that mixture 1A is the most successful in consistent results and best reflectivity. Best results occur in coating with a #10 or #11 gauge coating rod.

The Ink Extender (Backing Coat)

This material is made from titanium dioxide, polyamide resin mixed with an alcohol blend.

The Ink Coat Powder

Hydrous Magnesium Silicate—300–500 microns

The Photographic Emulsion

This ingredient is conventional. It may be any compatible photographic emulsion capable of being imaged with actinic light.

Acrylic water based emulsion.

Polyvinyl alcohol with diazo or chromate light sensitive additive.

Preferred emulsion—PVAC emulsion with diazo light sensitive additive.

Process for Making the Decorative Foil Transfer

Description of the Preferred Embodiment

The preferred process of this invention comprises initially preparing a multilayered assembly of materials which are ultimately to be exposed to actinic light under a negative comprising the illustration of the design to be applied to the surface to be decorated. To initiate the process, the operator takes a piece of untreated polypropylene film and lays it flat on the work surface. The following steps are then performed:

(1) A clear or colored lacquer is then applied using a wire wound rod known as a Myer rod. This coating is then dried, preferably with an air blower or other suitable means.

(2) Next a clear water base coating is applied over the lacquer to protect it. This coating is dried, preferably with an air blower or other suitable means.

(3) Next liquid foil is applied over the water base coating. This coating is dried, preferably with an air blower or other suitable means. It has been discovered that without the water base coating, liquid foil would re-dissolve or scratch the lacquer coating.

(4) Next an ink extender is applied to protect the liquid foil. This aids in giving body and flexibility to the ultimate design. This coating is dried, preferably with an air blower or other suitable means. It has been discovered that by using an ink extender that has been made with solvents not used to prepare the liquid foil, protection of the liquid foil from redissolving or scratching is accomplished.

(5) Next an ink coat powder is spread and rubbed lightly over the sheet. Excess powder is blown off the sheet with an air blower or other suitable means. Because of the inherent smooth finish of the extender, this powder layer is used to slightly scratch the extender layer to avoid pitting and mottling of the photo emulsion layer.

(6) Next a pre-sensitized photo emulsion is applied over the extender layer. This coating is dried, preferably with an air blower or other suitable means.

(7) After the above described assembly of layers of materials has been prepared, the entire assembly is then exposed through a negative to an actinic or ultraviolet light. The negative contains the design to be ultimately formed on this polypropylene coated sheet. During the exposure process, light passing through the light parts of the negative exposes and polymerizes or hardens the portions of the photo emulsion layer exposed to the light.

(8) After exposing the assembly of materials, the unexposed photo emulsion and the ink coat powder lying beneath the unexposed photo emulsion are then removed with warm water and a soft pad. This coating is dried, preferably with an air blower or other suitable means.

(9) Next, the ink extender beneath the removed ink coat powder is removed using a traditional ink developing method. This coating is dried, preferably with an air blower or other suitable means.

(10) Next, the liquid foil and clear water base coating beneath the removed ink extender are removed using a developing fluid and a soft pad. This coating is dried, preferably with an air blower or other suitable means.

(11) Finally, the clear or colored lacquer beneath the removed liquid foil and clear water base coating is removed with a lacquer solvent. This coating is dried, preferably with an air blower or other suitable means.

After the coating, now comprising the exposed photo emulsion layer, is dried, it is now ready to be applied to the surface to be decorated. This is achieved using a liquid foil adhesive applied with a coating rod over the entire imaged sheet. This adhesive is designed to bond with the original hydrophobic film, non-image area, and bond to the surface photo emulsion coating, image area. The sheet is then ready to be positioned onto the desired surface to be decorated. By rubbing on the image area over the film, the image breaks away from the substrate to adhere to the desired surface.

Other options exist if a rub-down transfer is not desired. These options would include doing the process on a film of non-release qualities such as polyester for non-transfer purposes such as a maneuverable overlay for repositioning purposes; or an adhesive application to the non-imaged side of a substrate such as polyester to be viewed through glass, clear plastic and the like for signage application.

Advantages of the Invention

The method described will eliminate many of the problems which are associated with hot foil transfers. Because the "foil" is in a liquid form, it is applied as needed per job. This eliminates keeping an inventory of transfer foil material in stock. The Liquid Foil is one color—silver. A tinted lacquer is first applied and then the Liquid Foil to the transfer substrate. By using dyes to tint the lacquer, it enables the color proofer to mix any tint required to color the foil. This coating method also allows use of a variety of substrates and flexibility in the number of colors used in combination with the Liquid Foil. With Liquid Foil the printing order of colors is flexible, (i.e.—in a five color transfer the foil can print 3rd, 5th, 1st or whatever is desired. This is opposed to hot stamp transfer foil where the foil must print first. There is no acid bath required in the process of this invention which insures crisp line characters and is not prone to "under-cutting."

It is to be understood that the embodiments herein described are merely illustrative of the principles of the present invention. Various modifications may be made by those skilled in the art without departing from the spirit or scope of the claims which follow.

We claim:

1. A method of making a layered sheet for producing transferrable decorative foil designs which comprises the steps of:

sequentially superimposing and drying upon a hydrophobic film:
(a) a water insoluble lacquer,
(b) a clear water soluble polymer,
(c) an organic solvent containing from 2 to 8% by weight of aluminum platelets having their largest dimension not greater than about 5000 microns and a thickness not greater than 1000 angstroms,
(d) an ink extender,
(e) an ink coat powder, and
(f) a pre-sensitized photographic emulsion;
exposing a portion of said hydrophobic film with superimposed layers a–f through a negative to light; and
removing layers a–f from an unexposed portion of said hydrophobic film.

2. The method of claim 1 wherein said light is actinic light.

3. The method of claim 1 wherein said light is ultraviolet light.

4. The method of claim 1 wherein said water insoluble lacquer is clear.

5. The method of claim 1 wherein the water insoluble lacquer is colored.

6. The method of claim 1 wherein the particle size of the aluminum platelets in relation to their length ranges between 3–100 microns.

7. The method of claim 1 wherein the organic solvent is a mixture of ethyl acetate and Glycol Ether PM.

8. The method of claim 1 wherein the solvent resistent hydrophobic film is a film of polypropylene.

* * * * *